United States Patent

Nasu et al.

(10) Patent No.: US 11,204,370 B2
(45) Date of Patent: Dec. 21, 2021

(54) PROBE

(71) Applicant: Kabushiki Kaisha Nihon Micronics, Tokyo (JP)

(72) Inventors: Mika Nasu, Oita (JP); Osamu Takeuti, Oita (JP)

(73) Assignee: Kabushiki Kaisha Nihon Micronics, Musashino (JP)

( * ) Notice: Subject to any disclaimer, the term of this patent is extended or adjusted under 35 U.S.C. 154(b) by 0 days.

(21) Appl. No.: 16/615,964

(22) PCT Filed: May 17, 2018

(86) PCT No.: PCT/JP2018/019040
§ 371 (c)(1),
(2) Date: Nov. 22, 2019

(87) PCT Pub. No.: WO2018/216588
PCT Pub. Date: Nov. 29, 2018

(65) Prior Publication Data
US 2020/0174038 A1 Jun. 4, 2020

(30) Foreign Application Priority Data

May 23, 2017 (JP) .............................. JP2017-101766

(51) Int. Cl.
*G01R 1/067* (2006.01)
(52) U.S. Cl.
CPC ..... *G01R 1/06722* (2013.01); *G01R 1/06733* (2013.01); *G01R 1/06761* (2013.01)
(58) Field of Classification Search
CPC ............ G01R 1/06722; G01R 1/06761; G01R 1/06733
See application file for complete search history.

(56) References Cited

U.S. PATENT DOCUMENTS 9,069,012 B2   6/2015  Yano et al.
10,775,411 B2 * 9/2020 Yoshioka ........... G01R 1/07328
(Continued)

FOREIGN PATENT DOCUMENTS

CN    103968697 A   8/2014
JP    H05203670 A   8/1993
(Continued)

OTHER PUBLICATIONS

JP 2007-024664 English translation (Year: 2007).*
KR 20130040290 A English translation (Year: 2013).*

*Primary Examiner* — Paresh Patel
(74) *Attorney, Agent, or Firm* — Lorenz & Kopf, LLP

(57) ABSTRACT

A probe includes: a rod-shaped plunger (11) including a tip section (111) and an insertion section (112) connected to the tip section (111); a tube-shaped barrel (12) in which the insertion section (112) of the plunger (11) is located inside; and a conductive first fixing member (131) which is located in an area where the plunger (11) and the barrel (12) face each other and is configured to fix the plunger (11) to the barrel (12), the first fixing member (131) having a lower melting point than that of the material of both of the plunger (11) and the barrel (12). The gap between the plunger (11) and the barrel (12) is filled with the first fixing member (131) without any voids in a cross section of the probe in an area where the plunger (11) and the barrel (12) overlap each other, including the area where the first fixing member (131) is located.

16 Claims, 9 Drawing Sheets

(56) References Cited

U.S. PATENT DOCUMENTS

| | | |
|---|---|---|
| 2004/0212383 A1 | 10/2004 | Yanagisawa et al. |
| 2004/0239356 A1 | 12/2004 | Kazama |
| 2005/0253605 A1 | 11/2005 | Lee |
| 2013/0057308 A1 | 3/2013 | Yano et al. |
| 2015/0247882 A1 | 9/2015 | Lee et al. |
| 2016/0118738 A1 | 4/2016 | Nasu et al. |

FOREIGN PATENT DOCUMENTS

| | | |
|---|---|---|
| JP | 2002267686 A | 9/2002 |
| JP | 2003014779 A | 1/2003 |
| JP | 2004354139 A | 12/2004 |
| JP | 2007024664 A | 2/2007 |
| JP | 2009063381 A | 3/2009 |
| JP | 2012007904 A | 1/2012 |
| JP | 2012058129 A | 3/2012 |
| JP | 2013053931 A | 3/2013 |
| JP | 2015141200 A | 8/2015 |
| KR | 20130040290 A | 4/2013 |

\* cited by examiner (a)

(b)

(c)

PROBE

TECHNICAL FIELD

The present invention relates to a probe used for measuring characteristics of an inspection subject.

BACKGROUND ART

Measuring characteristics of an inspection subject on a wafer, such as an integrated circuit, uses a probe which is brought into contact with the inspection subject. In the structure of such a probe, a plunger as a small-diameter conductive section that comes into contact with the inspection subject is connected to a barrel as a cylindrical section that freely compresses so that the plunger comes into contact with the inspection subject with a proper pressure (see Patent Literature 1, for example).\

CITATION LIST

Patent Literature

PTL 1: Japanese Patent Laid-open Publication No. 2013-53931

SUMMARY OF INVENTION

Technical Problem

The plunger and barrel can be fixed by spot welding. However, when the plunger and barrel are fixed by spot welding, pressure due to spot welding causes a phenomenon of the barrel bulging outward. It is therefore necessary to increase the spacing between probes in order to prevent the probes from coming into contact with each other. This inhibits arrangement of probes with a narrow pitch.

In the light of the aforementioned problems, an object of the present invention is to provide a probe which includes a plunger and a barrel fixed to each other and is able to be arranged with a narrow pitch and to provide a manufacturing method of the same.

Solution to Problem

According to an aspect of the present invention, a probe includes: a rod-shaped plunger including a tip section and an insertion section connected to the tip section; a tube-shaped barrel in which the insertion section of the plunger is located inside; and a conductive first fixing member which is provided in an area where the plunger and the barrel face each other and is configured to fix the plunger to the barrel, the first fixing member having a lower melting point than that of the material of both of the plunger and the barrel. The gap between the plunger and the barrel is filled with the first fixing member without any voids, in a cross section of the probe in an area where the plunger and the barrel overlap each other, including the area where the first fixing member is located.

According to another aspect of the present invention, a method of manufacturing a probe which includes: a rod-shaped plunger including a tip section and an insertion section connected to the tip section; and a tube-shaped barrel in which the insertion section of the plunger is located inside, includes the steps of: forming a conductive first fixing member in a particular area of at least one of the plunger and the barrel, the first fixing member having a lower melting point than the material of both of the plunger and the barrel; inserting the insertion section of the plunger into the barrel from an opening end of the barrel so that the plunger and the barrel are connected with the first fixing member interposed therebetween in the particular area; and melting the first fixing member to fix the plunger to the barrel.

Advantageous Effects of Invention

According to the present invention, it is possible to provide a probe which includes a plunger and a barrel fixed to each other and is able to be arranged with a narrow pitch and provide a manufacturing method of the same.

BRIEF DESCRIPTION OF DRAWINGS

FIG. 5(b) illustrating the plunger on which the first fixing member is provided; and FIG. 5(c) illustrating the plunger and barrel which are fixed to each other.

DESCRIPTION OF EMBODIMENT

Figure 1:
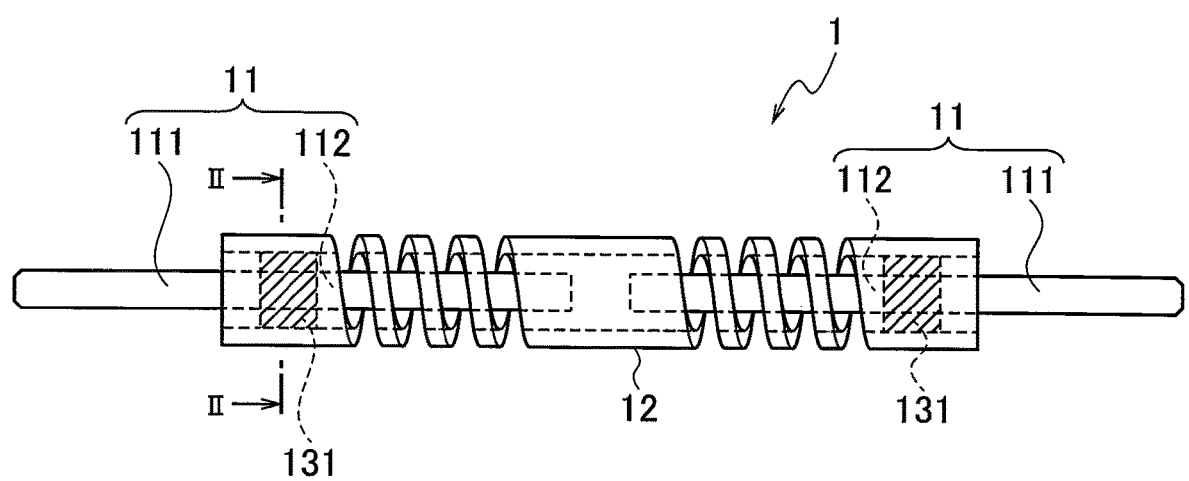
FIG. 1 is a schematic view illustrating the configuration of a probe according to a first embodiment of the present invention.

Next, embodiments of the present invention are described with reference to the drawings. In the following description of the drawings, the same or similar portions are given the same or similar reference numerals. The drawings are schematic, and it should be noted that thickness proportions and the like are different from real ones. It is also obvious that dimensional relationship or proportions of some portions are different from each other between the drawings. The embodiments below illustrate a device and a method to embody the technical idea of the present invention. The embodiments of the present invention do not specify the material, shape, structure, arrangement, and the like of the constituent components to those described below.

First Embodiment

As illustrated in FIG. 1, a probe 1 according to a first embodiment of the present invention includes rod-shaped plungers 11, a tube-shaped barrel 12, and first fixing members 131. Each rod-shaped plunger 11 includes a tip section 111 and an insertion section 112 connecting to the tip section 111. The insertion section 112 of the plunger 11 is located within the barrel 12. The first fixing members 131 fix the plungers 11 to the barrel 12. The first fixing members 131 are located in areas where the respective plungers 11 face the barrel 12 and are made of a material having a lower melting point than the material of both of the plungers 11 and barrel 12. The barrel 12 includes a consistent outer diameter as illustrated in FIG. 1. For easy understanding, the first fixing members 131 are indicated by hatching (the same applies below).

Figure 2:
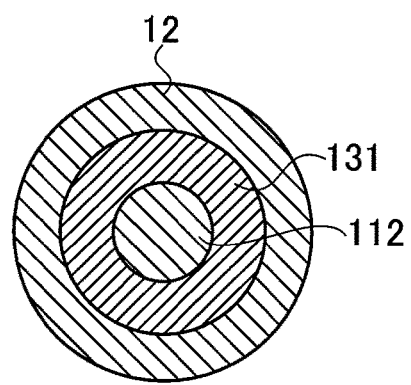
FIG. 2 is a schematic cross-sectional view illustrating the configuration of the probe according to the first embodiment of the present invention.

FIG. 2 illustrates a cross-section of the area where one of the plungers 11 is fixed to the barrel 12 with the first fixing member 131. As illustrated in FIG. 2, in the cross-section of the area where the plunger 11 overlaps the barrel 12, including the area where the first fixing member 131 is provided, the first fixing member 131 fills the gap between the surface of the plunger 11 and the inner wall surface of the barrel 12, leaving no voids.

In the probe 1 illustrated in FIG. 1, the plungers 11 are inserted into respective open ends at both ends of the barrel 12. The probe 1 is used to acquire electric characteristics of an inspection subject, for example. In this case, the tip section 111 of one of the plungers 11 comes into contact with the inspection subject. The tip section 111 of the other plunger 11 comes into contact with a terminal of a wiring circuit board or the like to be electrically connected to a measurement apparatus, such as a tester, through the wiring circuit board.

The plungers 11 and barrel 12 are therefore made of conductive materials. For example, the plungers 11 are made of an AgPdCu material, and the barrel 12 is made of a Ni material. The first fixing materials 131 are made of a conductive material since the plungers 11 and barrel 12 are electrically connected through the first fixing materials 131.

As illustrated in FIG. 1, the barrel 12 includes spiral cuts that penetrate the side surface of the barrel 12. The barrel 12 partially includes spring-like structures. The barrel 12 freely expands and compresses in the axial direction. The plungers 11 are thereby able to come into contact with the inspection subject or wiring circuit board with proper pressure. The spiral cuts are not provided in an area where the plungers 11 are not located inside.

Figure 3:
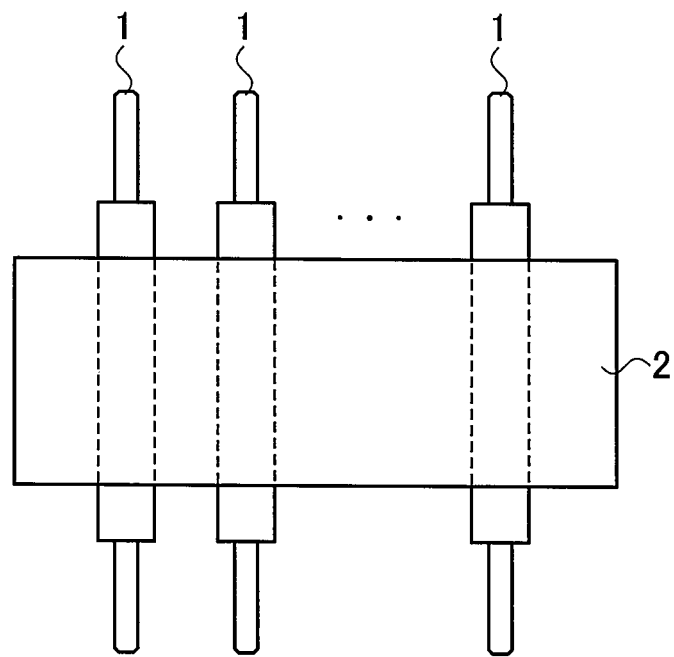
FIG. 3 is a schematic view illustrating an example of how the probes according to the first embodiment of the present invention are held.

The probes 1 are held by a socket 2 as illustrated in FIG. 3, for example. A necessary number of probes 1 to measure the inspection subject are arranged so as to penetrate the socket 2. The plungers 11 exposed from one of main surfaces of the socket 2 come into contact with the inspection subject. The plungers 11 exposed from the other main surface of the socket 2 are electrically connected to a measurement apparatus.

The following describes a method of manufacturing the probe 1 illustrated in FIG. 1. The following method of manufacturing the probe 1 is only an example. It is certain that the method of manufacturing the probe 1 is implemented by other various manufacturing methods including modifications thereof.

Figure 4:
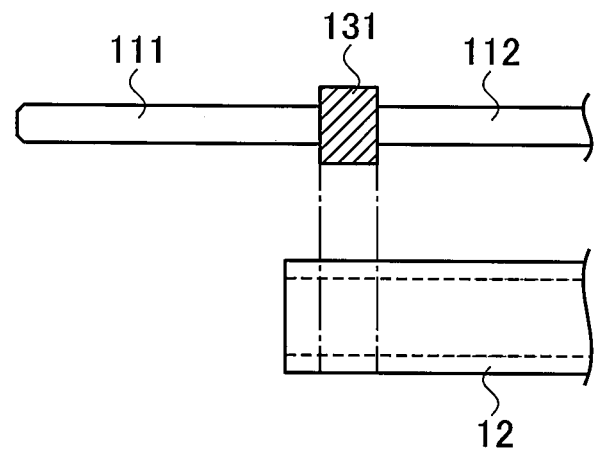
FIG. 4 is a schematic view illustrating a formation example of a first fixing member of the probe according to the first embodiment of the present invention.

At first, each of the first fixing members 131, which have a melting point lower than that of both of the plungers 11 and barrel 12, is formed in a particular area of at least one of the plunger 11 and the barrel 12. For example, as illustrated in FIG. 4, the first fixing member 131 is formed on the surface of the plunger 11. The area where the first fixing member 131 is formed corresponds to the area at a certain distance from an open end of the barrel 12 as illustrated with dashed lines in FIG. 4.

The insertion section 112 of each plunger 11 is inserted into the barrel 12 from the open end thereof so that the plunger 11 and barrel 12 are connected through the first fixing member 131 in the particular area. The first fixing member 131 is then melted to fix the plunger 11 to the barrel 12.

The first fixing member 131 is melted by heat treatment, for example. The first fixing member 131 is melted by reflow in a high-temperature environment, for example.

The particular area where each first fixing member 131 is formed in the aforementioned manufacturing method is the area where the plunger 11 faces the barrel 12 when the plunger 11 is connected to the barrel 12, which is referred to as a fixing area hereinafter. The first fixing member 131 can be formed in the fixing areas by using various methods depending on the type of the first fixing member 131. The method of forming the first fixing member 131 is Au/Sn plating or application of solder paste.

In the probe 1, electric signals are transmitted through the plungers 11 and barrel 12 as described already. The electric resistance between each plunger 11 and barrel 12 therefore needs to be low. The first fixing members 131 that electrically connect the plungers 11 and barrel 12 preferably fill the gap between the plungers 11 and barrel 12, leaving no voids. Each first fixing member 131 is therefore formed so as to be continuous in the circumferential direction on the side surface of the corresponding plunger 11. In the cross-section of the fixing area where the first fixing member 131 is formed, the gap between the plunger 11 and barrel 12 is filled with the melted first fixing member 131 without any voids.

Figure 5:
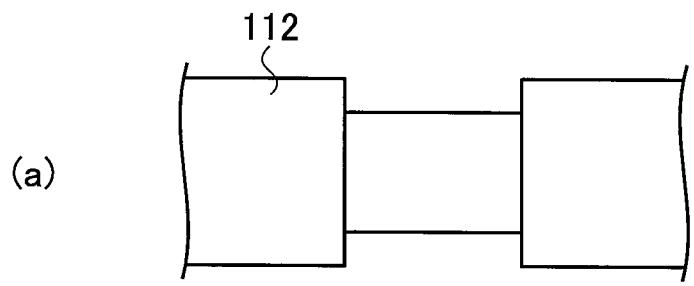
FIGS. 5(a) to 5(c) are schematic views illustrating another formation example of the first fixing member of the probe according to the first embodiment of the present invention, FIG. 5(a) illustrating a plunger before the first fixing member is provided.
Figure 5:
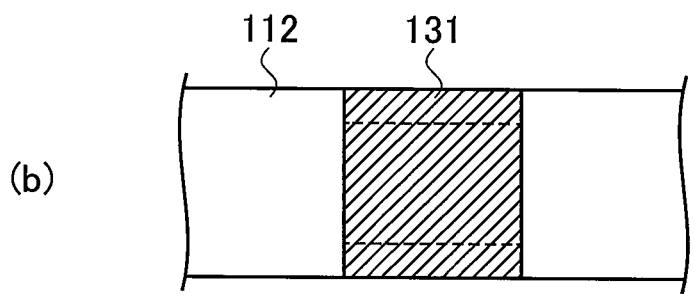
Figure 5:
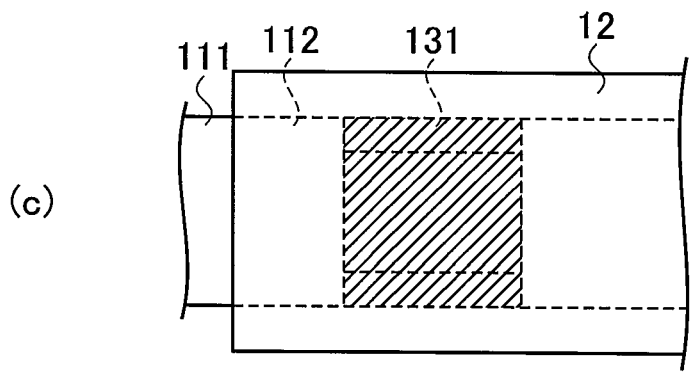

The first fixing member 131 may be formed as follows: a recess is formed in the surface of the insertion section 112 of the plunger 11 along the outer edge as illustrated in FIG. 5(a); and the first fixing member 131 is formed within the recess as illustrated in FIG. 5(b). FIG. 5(c) illustrates a state where the plunger 11 illustrated in FIG. 5(b) is fixed to the barrel 12.

Forming the first fixing member 131 in the recess provided in the surface of the insertion section 112 can reduce the gap between part of the plunger 11 not including the recess and the barrel 12 as illustrated in FIG. 5(c). This improves the current capacity of the probe 1. In addition, the surface of the plunger 11 and the inner wall surface of the barrel 12 are also able to be joined in the area other than the fixing area. This further reduces the electric resistance between the plunger 11 and barrel 12.

In the aforementioned example, the first fixing members 131 are formed on the plungers 11. However, the first fixing members 131 can be formed on either the plunger 11 or barrel 12. Alternatively, the first fixing member 131 may be formed on both of the plunger 11 and barrel 12.

Figure 6:
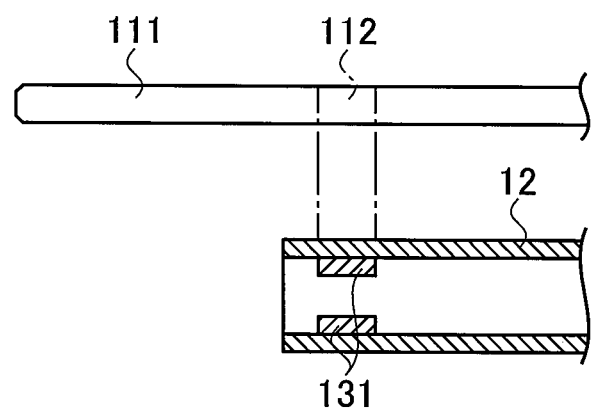
FIG. 6 is a schematic view illustrating still another formation example of the first fixing member of the probe according to the first embodiment of the present invention.
Figure 7:
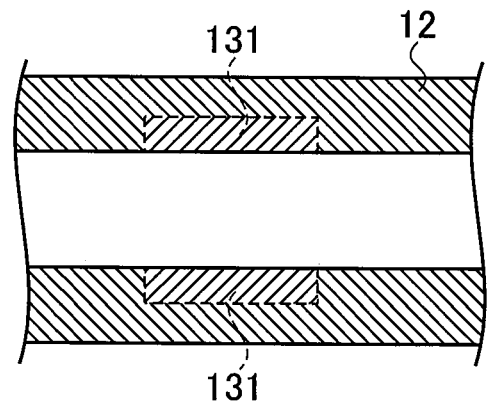
FIG. 7 is a schematic view illustrating still another formation example of the first fixing member of the probe according to the first embodiment of the present invention.

FIG. 6 illustrates an example of the first fixing member 131 formed on the surface of the barrel 12. As illustrated in FIG. 7, the first fixing member 131 may be formed in the recess provided in the inner wall surface of the barrel 12. Forming the first fixing member 131 in the recess allows the gap between the plunger 11 and barrel 12 to be narrow also in the area other than the fixing area. This increases the current capacity of the probe 1 and reduces the electric resistance between the plunger 11 and barrel 12 as described above. The first fixing member 131 may be formed within recesses that are provided both in the surface of the insertion section 112 of the plunger 11 and in the inner wall surface of the barrel 12.

Figure 8:
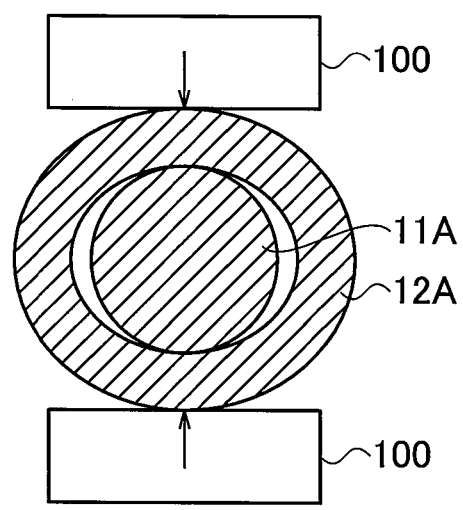
FIG. 8 is a schematic cross-sectional view for explaining a method of manufacturing a probe of Comparative Example.
Figure 9:
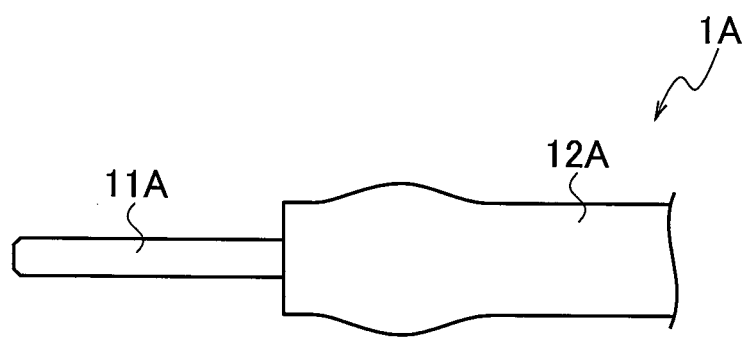
FIG. 9 is a schematic view illustrating the shape of the probe of Comparative Example.

FIG. 8 illustrates a method of fixing a plunger 11A to a barrel 12A by spot welding as Comparative Example. During spot welding, the plunger 11A and barrel 12A are pressed in directions of arrows by electrodes 100 while current is applied to the plunger 11A and barrel 12A. This produces resistance heat in the contact interface between the plunger 11A and barrel 12A. The produced resistance heat causes melt and solidification of metal within the plunger 11A and barrel 12A for welding of the plunger 11A and barrel 12A. The pressing in this process causes deformation, so that the surface of the barrel 12A bulges as illustrated in FIG. 9.

If the surfaces of probes are able to bulge, it is necessary to widen the spacing between the probes in order to prevent the probes from coming into contact with each other. This inhibits arrangement of the probes with a narrow pitch.

According to the method of manufacturing the probe 1 of the first embodiment of the present invention described above, fixing the plungers 11 to the barrel 12 does not need pressing. The fixing areas of the barrel 12 fixed to the plungers 11 therefore do not bulge, and the barrel 12 has a consistent outer diameter. The probes are therefore able to be arranged with a narrow pitch.

Figure 10:
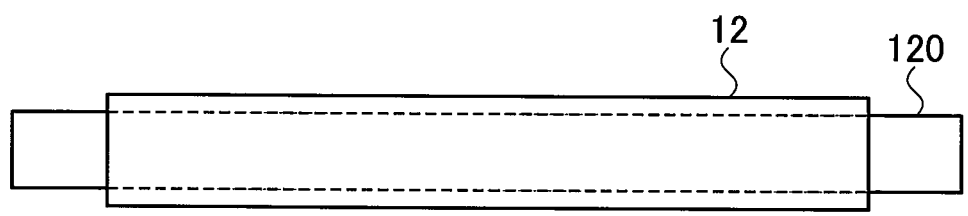
FIG. 10 is a schematic view for explaining a method of forming the barrel.
Figure 11:
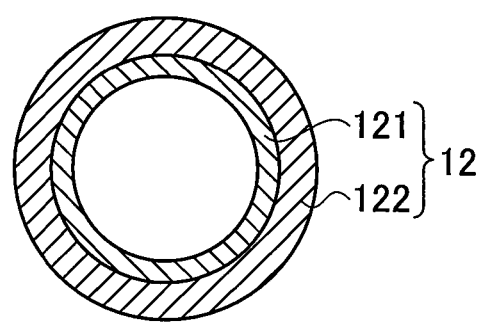
FIG. 11 is a schematic cross-sectional view illustrating the configuration of the barrel.

The spiral cuts in the barrel 12 are formed with a core 120 inserted in the barrel 12 as illustrated in FIG. 10. The spiral cuts are formed by photolithography, for example. The barrel 12 preferably has a multilayer structure as illustrated in FIG. 11. For example, an inner layer 121 is made of an Au material while an outer layer 122 is made of a Ni material. In the process of etching the side surface of the barrel 12, the inner layer 121 therefore prevents the etching material from being applied from the inside of the barrel 12. In addition, when the inner layer 121 is made of an Au material, the core 120 is pulled out of the barrel 12 smoothly.

When the barrel 12 has a multilayer structure, the inner layer 121 may be made of a material which reacts with the melted first fixing member 131 to form an alloy. This allows the plungers 11 to be fixed to the barrel 12 more firmly.

Modification

Figure 12:
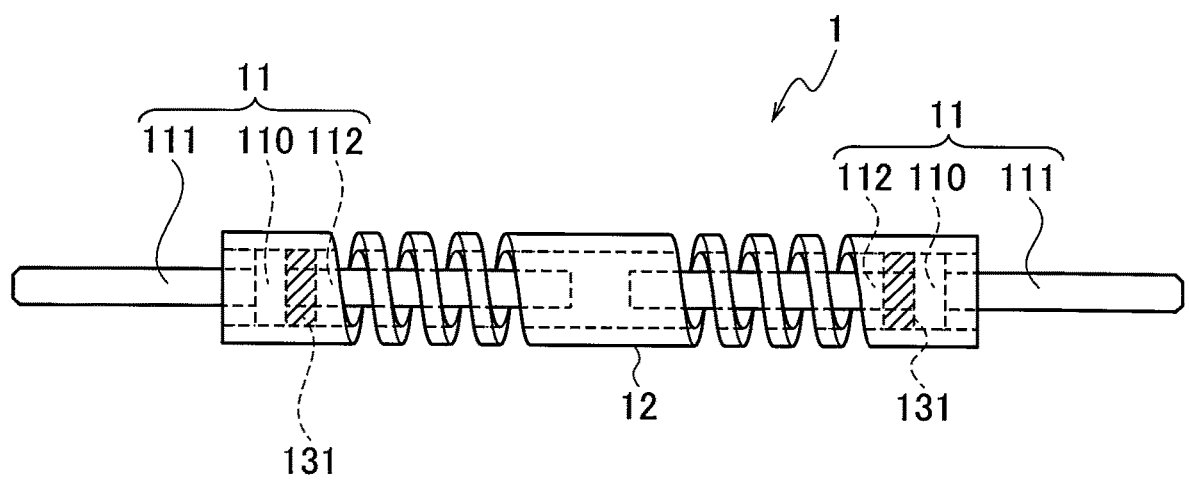
FIG. 12 is a schematic view illustrating the configuration of a probe according to a modification of the first embodiment of the present invention.

A probe 1 according to a modification of the first embodiment illustrated in FIG. 12 is provided with a stopper 110 in the insertion section 112 of each plunger 11. In the insertion section 112, the stopper 110 is formed in an area closer to an opening of the barrel 12 from which the plunger 11 is inserted than the area that comes into contact with the first fixing member 131. The insertion section 112 prevents the first fixing member 131 from moving toward the opening of the barrel 12. The stopper 110 forms a flange shape having an outer diameter greater than that of the area coming into contact with the first fixing member 131.

So long as the stopper 110 can be inserted into the barrel 12, it is preferable that the outer diameter of the stopper 110 is maximized. This effectively prevents the first fixing member 131 from flowing to the tip section 111 of the plunger 11 before solidified.

Second Embodiment

Figure 13:
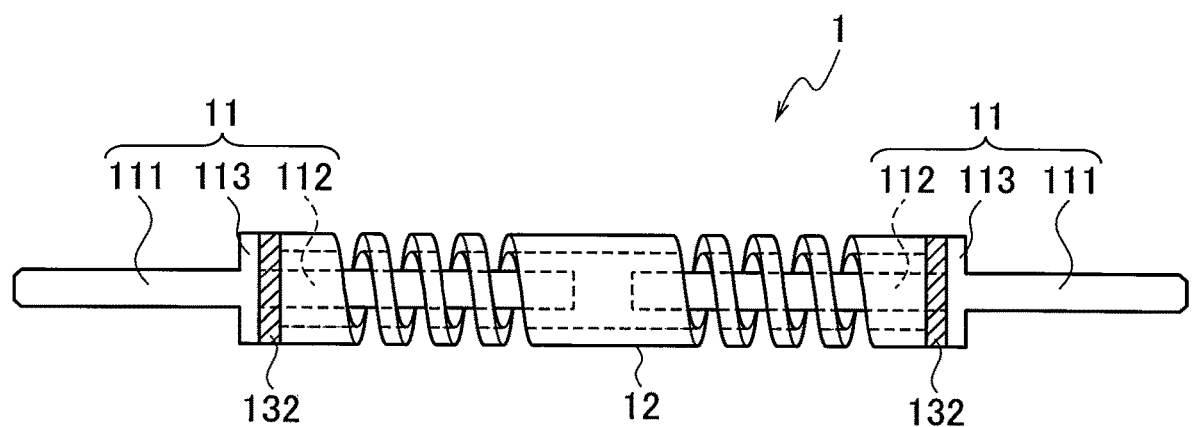
FIG. 13 is a schematic view illustrating the configuration of a probe according to a second embodiment of the present invention.

FIG. 13 illustrates a probe 1 according to a second embodiment of the present invention. In the probe 1 illustrated in FIG. 13, each plunger 11 includes a protrusion area 113 between the tip section 111 and insertion section 112. The outer diameter of the protrusion area 113 is greater than the inner diameter of the barrel 12.

Figure 14:
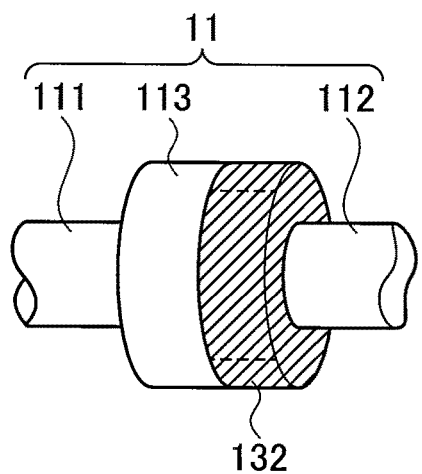
FIG. 14 is a schematic perspective view illustrating the method of forming a second fixing member of the probe illustrated in FIG. 13.

In the probe 1 illustrated in FIG. 13, a second fixing member 132 is formed in the surface of the protrusion area 113 that faces the end face of the opening end of the barrel 12 as illustrated in FIG. 14. When the insertion section 112 of the plunger 11 is inserted into the barrel 12, therefore, the protrusion area 113 of the plunger 11 is fixed to the end face of the opening end of the barrel 12 with the second fixing member 132.

According to the probe 1 illustrated in FIG. 13, the position of the melted second fixing member 132 is stabilized. In other words, the melted second fixing member 132 is prevented from flowing from a predetermined position.

In the example illustrated above, the second fixing member 132 is formed on the protrusion area 113 of the plunger 11. The second fixing member 132 may be formed on the end face of the opening end of the barrel 12. Alternatively, the second fixing member 132 may be formed both on the protrusion area 113 of the plunger 11 and on the end face of the opening end of the barrel 12.

Figure 15:
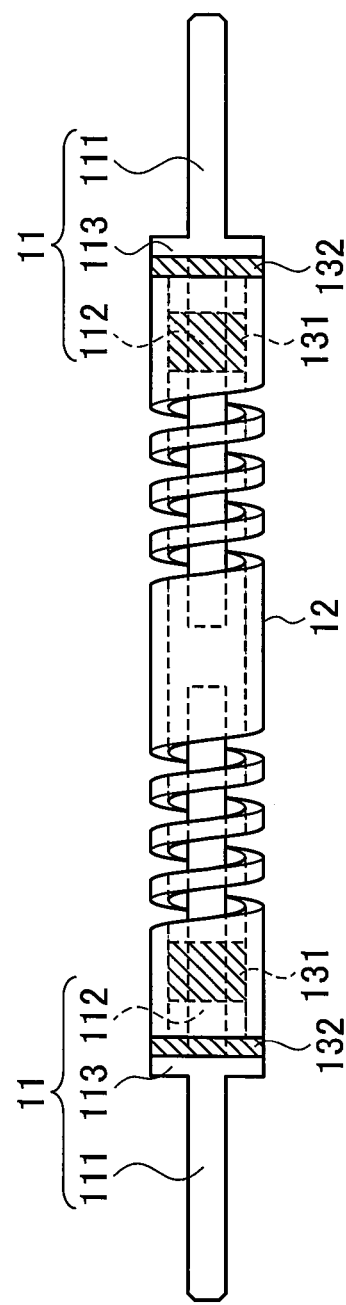
FIG. 15 is a schematic view illustrating the configuration of a probe according to another embodiment of the present invention.

As illustrated in FIG. 15, the first fixing members 131 may be provided between the insertion section 112 of each plunger 11 and the inner wall surface of the barrel 12 while the second fixing members 132 are provided between the protrusion area 113 of each plunger 11 and the corresponding opening end of the barrel 12. These areas both serve as the fixing areas. Such plural joint areas allow the plungers 11 to be fixed to the barrel 12 more firmly.

Other Embodiment

The present invention is explained through the embodiments as described above. However, it should not be understood that the description and drawings constituting a part of the disclosure limits the present invention. This disclosure will reveal various substitutions, examples, and operation techniques for those skilled in the art.

In the above description, the probe 1 includes a circular cross-sectional shape. However, the cross-sectional shape may be polygonal, or rectangular.

It is certain that the present invention includes various embodiments not described herein and the like.

INDUSTRIAL APPLICABILITY

The probe according to the embodiments is applicable to the field of characteristic measurements of inspection subjects.

What is claimed is:
1. A probe, comprising:
a rod-shaped plunger including a tip section and an insertion section connected to the tip section;
a tube-shaped barrel in which the insertion section of the plunger is located inside;

a conductive first fixing member which is located in an area where the plunger and the barrel face each other and is configured to fix the plunger to the barrel, the first fixing member having a lower melting point than that of the material of both of the plunger and barrel; and a stopper located inside the barrel and away from an opening of the barrel in which the plunger is inserted, the stopper located closer to the opening of the barrel than the first fixing member, wherein the gap between the plunger and the barrel is filled with the first fixing member without any voids, in a cross section of the probe in an area where the plunger and the barrel overlap each other, including the area where the first fixing member is located, and the stopper prevents the first fixing member from moving toward the opening of the barrel.

2. The probe according to claim 1, wherein the stopper forms a flange shape with an outer diameter that is greater than that of the area in contact with the first fixing member.

3. The probe according to claim 1, wherein the first fixing member is located in a recess provided in the surface of the insertion section.

4. The probe according to claim 1, wherein the first fixing member is located in a recess provided in the inner wall surface of the barrel.

5. The probe according to claim 1, wherein the barrel has a multilayer structure including an outer layer and an inner layer.

6. The probe according to claim 5, wherein a material which forms an alloy with the first fixing material is provided in an area that is in contact with the first fixing member in the inner layer of the barrel.

7. A probe, comprising:
a rod-shaped plunger including a tip section and an insertion section connected to the tip section;
a tube-shaped barrel in which the insertion section of the plunger is located inside; and
a conductive first fixing member which is located in an area where the plunger and the barrel face each other and is configured to fix the plunger to the barrel, the first fixing member having a lower melting point than that of the material of both of the plunger and barrel, wherein a gap between the plunger and the barrel is filled with the first fixing member without any voids, in a cross section of the probe in an area where the plunger and the barrel overlap each other, including the area where the first fixing member is located, the plunger includes a protrusion area between the tip section and the insertion section, the protrusion area including an outer diameter that is greater than the inner diameter of the barrel, the protrusion area of the plunger is fixed to an end face of an opening end of the barrel with a second fixing member, and the protrusion area prevents the second fixing member from flowing from a predetermined position.

8. A method of manufacturing a probe which includes: a rod-shaped plunger including a tip section and an insertion section connected to the tip section; and a tube-shaped barrel in which the insertion section of the plunger is located inside, the method comprising:

forming a conductive first fixing member in a particular area of either the plunger or the barrel, the first fixing member having a lower melting point than the material of both of the plunger and the barrel;

inserting the insertion section of the plunger into the barrel from an opening end of the barrel so that the plunger and the barrel are connected with the first fixing member interposed therebetween in the particular area;

melting the first fixing member to fix the plunger to the barrel; and providing a stopper in the insertion section at a location closer to the opening end of the barrel than the first fixing member, the stopper configured to prevent the first fixing member from moving toward the opening end of the barrel;

wherein the first fixing member is formed on the side surface of the plunger to be continuous in the circumferential direction, and the gap between the plunger and the barrel is filled with the melted first fixing member without any voids in a cross section of the probe in an area where the plunger and the barrel overlap each other, including the area where the first fixing member is formed.

9. The method of manufacturing a probe according to claim 8, wherein the first fixing member is melted by heat treatment.

10. The method of manufacturing a probe according to claim 8, wherein the first fixing member is formed on the surface of the insertion section.

11. The method of manufacturing a probe according to claim 10, wherein the first fixing member is formed in a recess provided in the surface of the insertion section.

12. The method of manufacturing a probe according to claim 8, wherein the first fixing member is formed on the inner wall surface of the barrel.

13. The method of manufacturing a probe according to claim 12, wherein the first fixing member is formed in a recess provided in the inner wall surface of the barrel.

14. The method of manufacturing a probe according to claim 8, wherein the barrel has a multilayer structure including an outer layer and an inner layer.

15. The method of manufacturing a probe according to claim 14, wherein an area of the inner layer of the barrel that comes into contact with the first fixing member is made of a material that forms an alloy with the first fixing member.

16. A method of manufacturing a probe which includes: a rod-shaped plunger including a tip section and an insertion section connected to the tip section; and a tube-shaped barrel in which the insertion section of the plunger is located inside, the method comprising:

forming a conductive first fixing member in a particular area of either the plunger or the barrel, the first fixing member having a lower melting point than the material of both of the plunger and the barrel;

inserting the insertion section of the plunger into the barrel from an opening end of the barrel so that the plunger and the barrel are connected with the first fixing member interposed therebetween in the particular area; and melting the first fixing member to fix the plunger to the barrel;

wherein the plunger includes a protrusion area between the tip section and the insertion section, the outer diameter of the protrusion area is greater than the inner diameter of the barrel, the protrusion area of the plunger is fixed to the end face of an opening end of the barrel with a second fixing member, and the protrusion area prevents the second fixing member from flowing from a predetermined position.

* * * * *